(12) United States Patent
Ho et al.

(10) Patent No.: US 7,245,523 B2
(45) Date of Patent: Jul. 17, 2007

(54) BISTABLE MAGNETIC DEVICE USING SOFT MAGNETIC INTERMEDIARY MATERIAL

(75) Inventors: ChiaHua Ho, Kaoshing (CN); Hsu Shun Chen, Maioli (CN)

(73) Assignee: Macronix International Co., Ltd., Hsinchu (TW)

( * ) Notice: Subject to any disclaimer, the term of this patent is extended or adjusted under 35 U.S.C. 154(b) by 43 days.

(21) Appl. No.: 11/223,548

(22) Filed: Sep. 9, 2005

(65) Prior Publication Data

US 2006/0017124 A1 Jan. 26, 2006

Related U.S. Application Data

(62) Division of application No. 10/437,852, filed on May 14, 2003, now Pat. No. 7,020,009.

(51) Int. Cl.
*G11C 11/00* (2006.01)

(52) U.S. Cl. .................. 365/158; 365/171; 365/173

(58) Field of Classification Search .................. 365/158
See application file for complete search history.

(56) References Cited

U.S. PATENT DOCUMENTS

| | | |
|---|---|---|
| 4,788,612 A | 11/1988 | Perlov |
| 5,541,868 A | 7/1996 | Prinz |
| 5,650,958 A | 7/1997 | Gallagher et al. |
| 5,661,062 A | 8/1997 | Prinz |
| 5,732,016 A | 3/1998 | Chen et al. |
| 6,118,624 A | 9/2000 | Fukuzawa et al. |
| 6,163,477 A | 12/2000 | Tran |
| 6,191,972 B1 * | 2/2001 | Miura et al. ................. 365/171 |
| 6,269,018 B1 * | 7/2001 | Monsma et al. ............ 365/145 |
| 6,295,225 B1 | 9/2001 | Oepts |
| 6,331,944 B1 | 12/2001 | Monsma et al. |
| 6,404,674 B1 | 6/2002 | Anthony et al. |
| 6,417,561 B1 | 7/2002 | Tuttle |
| 6,436,526 B1 * | 8/2002 | Odagawa et al. ........... 428/332 |
| 6,711,053 B1 * | 3/2004 | Tang .......................... 365/158 |
| 6,728,132 B2 | 4/2004 | Deak |
| 6,740,947 B1 * | 5/2004 | Bhattacharyya et al. .... 257/421 |
| 6,826,076 B2 * | 11/2004 | Asano et al. ................ 365/158 |
| 6,909,633 B2 * | 6/2005 | Tsang ......................... 365/173 |

OTHER PUBLICATIONS

P. Grunberg, et al., "Interlayer Exchange Coupling," Encyclopedia of Materials: Science and Technology, Elsevier Science (2001).

* cited by examiner

*Primary Examiner*—Son L. Mai
(74) *Attorney, Agent, or Firm*—Warren S. Wolfeld; Haynes Beffel & Wolfeld

(57) ABSTRACT

Roughly described, a magnetic structure includes an electrically conductive path for carrying current flow, a soft magnetic material with high permeability value in magnetic communication with the current flow so that it can be magnetized in either of two directions, and a magnetic device such as a magnetic random access memory cell, having an active layer that is quantum mechanically or magnetostatically coupled to the soft magnetic material. The soft magnetic material acts as an intermediary between the magnetic induction of the current flow and the magnetization of the active layer of the magnetic device to reduce the writing current.

36 Claims, 6 Drawing Sheets

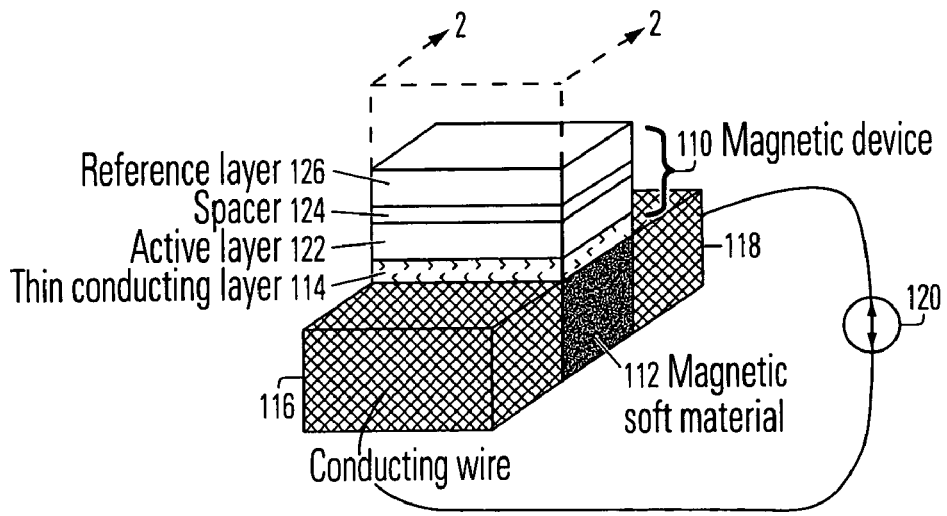
FIG. 1
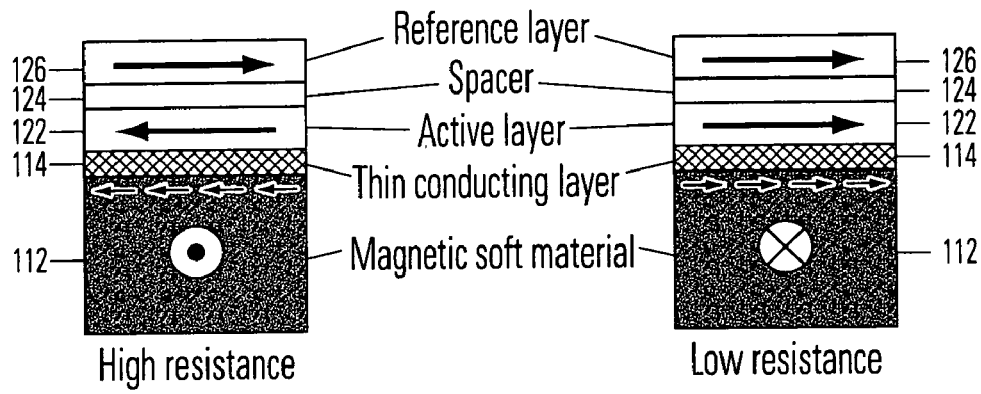
FIG. 2A  FIG. 2B
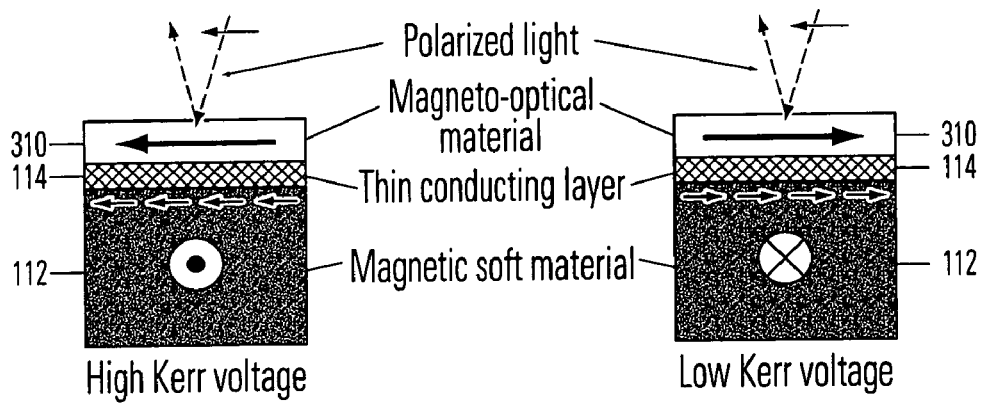
FIG. 3A  FIG. 3B

High resistance

Low resistance

High Kerr voltage

Low resistance (1) Write
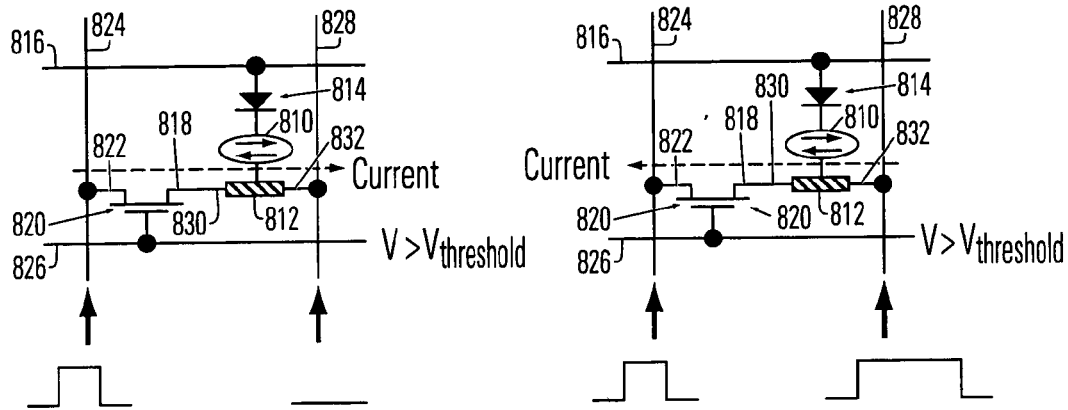
FIG. 8A  FIG. 8B
(2) Read
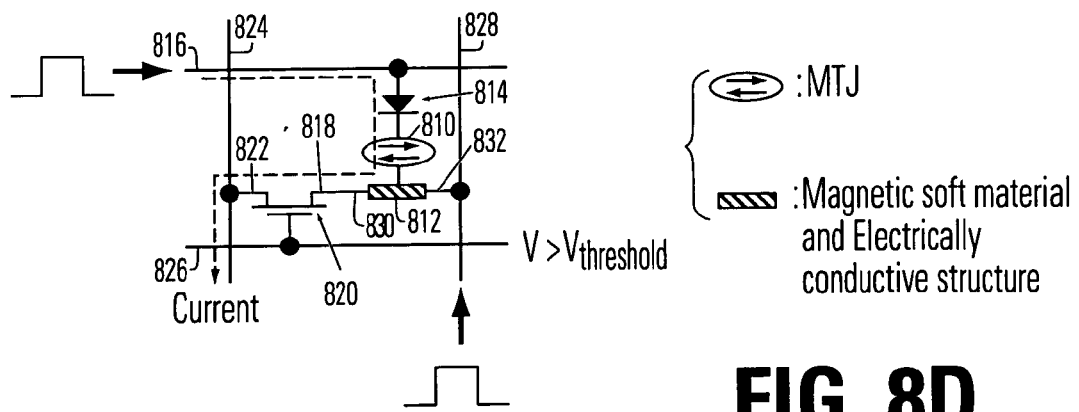
FIG. 8C  FIG. 8D

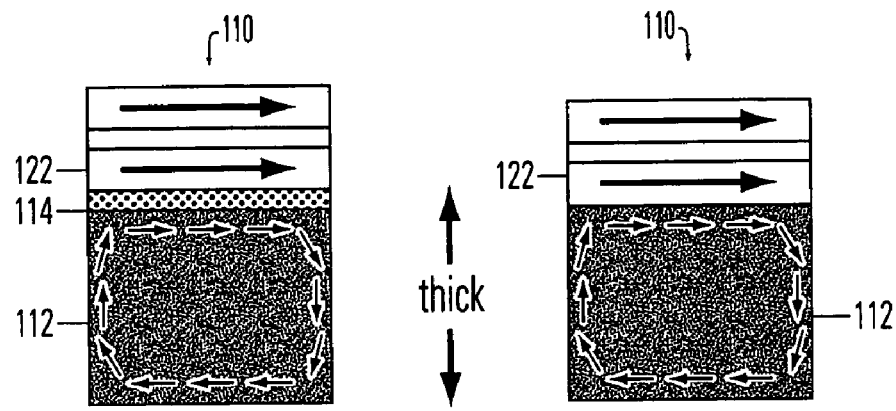
FIG. 10A   FIG. 10B
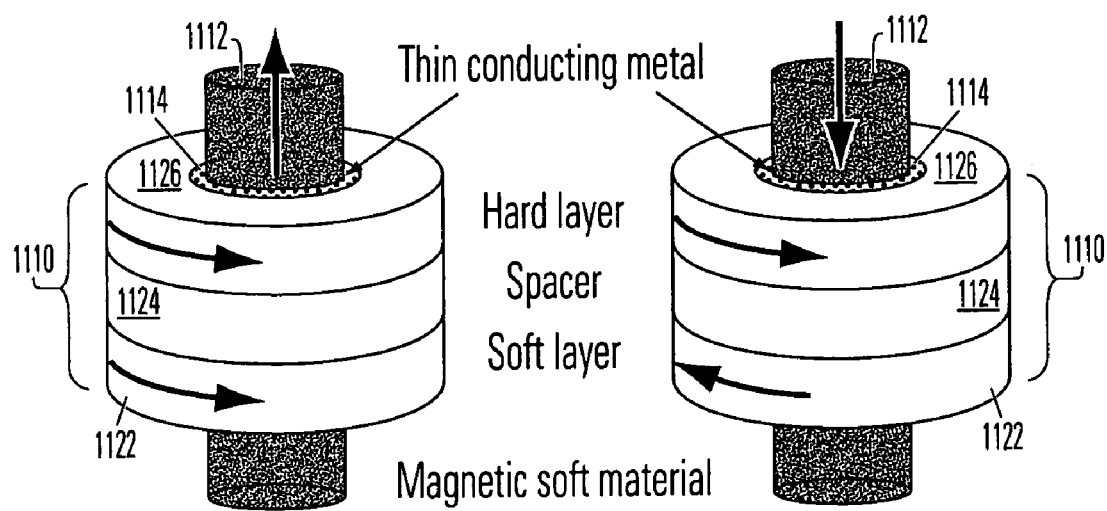
FIG. 11A   FIG. 11B

US 7,245,523 B2

BISTABLE MAGNETIC DEVICE USING SOFT MAGNETIC INTERMEDIARY MATERIAL

RELATED APPLICATIONS

This application is a divisional of application Ser. No. 10/437,852 filed 14 May 2003, U.S. Pat. No. 7,020,009.

BACKGROUND OF THE INVENTION

The invention relates to magnetic devices that exploit the dependence of a physical property, such as resistance, emission current or optical behavior, on the relative magnetization direction of the device. Such devices include, without limitation, magnetic memory cells, magnetic random access memories (MRAM), spin transistors, and near-field magneto-optical applications. More specifically, the invention relates to techniques for reducing the writing current required for the device to switch states, and increasing the magnetization stability and power gain of the device.

A magnetic memory cell is a non-volatile memory that typically includes a portion of anisotropic magnetoresistive (AMR), colossus magnetoresistive (CMR), giant magnetoresistive (GMR) or magnetic tunnel junction (MTJ) material cooperating with electronic read and write circuits. The device employs a magnetic vector direction to store memory states, and a magnetoresistive effect for memory readout. In a GMR device, two or more layers of ferromagnetic material are separated by a thin metallic layer. An MTJ device has two ferromagnetic layers separated by a thin electrical insulator that acts as a tunneling barrier. Although these two types of devices operate according to different physical principles, in both types of memory cells, the electrical resistance to current flow through the device is substantially different if the two ferromagnetic layers are magnetized in a common direction (parallel magnetization) compared to when they are magnetized in opposite directions (antiparallel magnetization). An AMR device or CMR device has a single ferromagnetic material that behaves according to the AMR or CMR property, respectively. In both types of memory cells, the electrical resistance to current flow through the device is also substantially different depending on the magnetization direction of the ferromagnetic material.

In a typical GMR or MTJ magnetic memory cell, one layer of ferromagnetic material is fixed ("pinned") in one direction and the second layer, referred to herein as the active layer, is made to change its magnetization in response to an applied external magnetic field over a certain threshold, named coercivity or coercive field or switching field. According to the direction of the magnetic vectors in the active layer of the device, states are stored, for example, the parallel direction can be defined as a logic "0", and the antiparallel direction can be defined as a logic "1", or vice-versa. If the magnetic memory cell is an AMR device or a CMR device, the single magnetic material as the active layer can change its permanent magnetization in response to an applied external magnetic field greater than the coercivity. According to the direction of the magnetic vectors in the active layer of the device, states are stored, similar to GMR or MTJ device, for example, the rightward direction can be defined as a logic "0", and the leftward direction can be defined as a logic "1", or vice-versa. The active layer of the device maintains these states even after removal of the external magnetic field. The state stored in the device can be read by a sense line which passes current through the device, since the different electrical resistance exhibited by the device due to the different magnetic vector directions in the active layer cause a different voltage output in the sense line.

A typical MRAM device includes an array of magnetic memory devices or cells. In one arrangement, word lines extend along rows of the memory cells and bit lines extend along columns of the memory cells. Each memory cell is located at a cross point of a word line and a bit line. The magnetization orientation of each memory cell (parallel or anti-parallel) may be changed by supplying currents to a word line and a bit line crossing the selected memory cell. When current flows through a bit line or a word line, it generates a magnetic field around the line. The arrays are designed so that each conductive line supplies only part of the field needed to reverse the magnetization of the active layer of the storage cells. Switching occurs only at those intersections where both word and bit lines are carrying current. Neither line by itself can switch a bit; only those cells addressed by both bit and word lines can be switched.

However, switching of the memory cells is not always reliable. Sometimes, the combined magnetic fields might not cause a memory cell to switch reliably and perfectly from parallel to anti-parallel or vice-versa for a GMR or MTJ device, or from right to left or vice-versa for an AMR or CMR device, due to such factors as the domain wall rotation, domain nucleation, interaction between bits, or the shape anisotropy. This problem can typically be solved by increasing crystal anisotropy, coercivity or the aspect ratio of the memory cells, but these solutions can lead to another problem: the amount of current for switching the memory cells is also increased. Increasing the amount of current increases the amount of power consumed by the MRAM device. Increasing the amount of current also results in larger bit and word lines and write circuits to handle the higher currents, resulting is a larger, more expensive MRAM device. Alternatively, the MRAM device could lose writing reliability by the electron migration effect.

Other problems with conventional MRAM arrays arise because of the need for ever-increasing levels of integration. But as memory cell size is reduced, the magnetic field required to write to the cell is increased, making it more difficult for the bit to be written. Again, larger writing currents can provide the required field strengths, but at the expense of larger conductors and write circuits. In addition, as conducting lines are made closer together, the possibility of cross talk between a conducting line and a cell adjacent to the addressed cell is increased. If this happens repeatedly, the stored magnetic field of the adjacent cell can erode, and the information in the cell can be rendered unreadable.

Therefore, a need exists to reduce the writing current required for switching a magnetic device, to improve switching reliability and stability, and to better isolate the cells of the array from each other.

SUMMARY OF THE INVENTION

According to the invention, roughly described, a soft magnetic material is formed as part of the magnetic structure to act as an intermediary for switching the active layer of the magnetic device. The structure includes an electrically conductive structure for carrying current flow, a first soft magnetic material in magnetic communication with the electrically conductive structure, and a magnetic device having an active layer of magnetic material disposed relative to the soft magnetic material such that the active layer becomes magnetized in one direction, at least in part in response to magnetization of the soft magnetic material in a particular direction (typically parallel to the direction in which the active layer becomes magnetized).

BRIEF DESCRIPTION OF THE DRAWINGS

The invention will be described with respect to particular embodiments thereof, and reference will be made to the drawings, in which:

FIGS. 1, 4, 5, 10A, 10B, 11A and 11B are symbolic diagrams of magnetic structures incorporating features of the invention.

FIGS. 2A and 2B are cross-sectional views of the structure FIG. 1, taken along sight lines 2—2.

FIGS. 3A and 3B illustrate a variation on the magnetic structure of FIG. 1, also taken along sight lines 2—2 of FIG. 1.

FIGS. 8A, 8B and 8C (collectively FIG. 8) are schematic diagrams of an electrical connection scheme that can be used for reading from and writing to a single cell magnetic memory incorporating features of the invention.

FIG. 8D is a key defining certain symbols used in FIGS. 8A, 8B and 8B.

DETAILED DESCRIPTION

Figure 4:
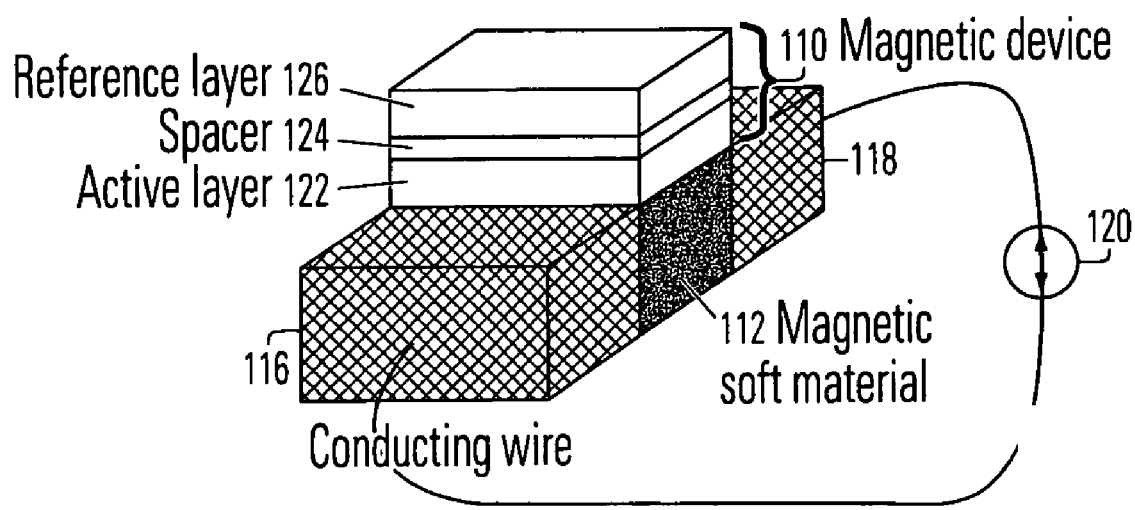

A "soft" magnetic material is a magnetic material that magnetizes strongly in a feeble magnetic field. As used herein, a soft magnetic material is one having a coercivity of less than about 1 Oe (~80 A/m), and a hard magnetic material is one having a coercivity of more than about 100 Oe (~8000 A/m). Soft magnetic materials also generally have a higher permeability than hard magnetic materials, making them better for amplifying flux generated by electrical currents. As used herein, "magnetize" means to set the magnetization of a material. By itself, the term does not require that the material attain permanent magnetization.

FIG. 1 is a symbolic diagram of a magnetic structure incorporating features of the invention. The structure includes a magnetic device 110 superposed over a soft magnetic material 112, separated by a thin conducting layer 114. The magnetic device 110 includes an active layer 122 which can be magnetized in either of two directions. It is disposed in sufficient proximity to the soft magnetic material 112 such that, by any of several mechanisms, magnetization of the soft magnetic material 112 will also magnetize the active layer 122. As used herein, the term "layer" can include more than one "sub-layer", each of which can also be referred to herein as a layer in itself. Layers also need not be homogenous, and can include more than one material.

The magnetic device can be any device that exploits the dependence of a physical property, such as resistance, emission current or optical behavior, on the relative magnetization direction of the device. Such devices include, without limitation, magnetic random access memory cells, spin transistors, and near-field magneto-optical applications. In the embodiment of FIG. 1, the magnetic device 110 is a magnetic memory cell, so above the active layer 122 is a spacer layer 124, which can be a thin metallic layer if the magnetic device 110 is a GMR device, or a thin insulating layer if the magnetic memory cell 110 is an MTJ device.

Above the spacer layer 124 is a reference layer 126, which has a magnetization that is fixed in one direction, for example through the use of a high coercivity ferromagnetic material, or by pinning with exchange bias coupling to antiferromagnetic or to synthetic antiferromagnetic coupling system material (not shown). If the magnetic device 110 is an AMR device or a CMR device, the spacer layer 124 and reference layer 126 are absent.

The soft magnetic material 112 is typically a ferromagnetic material, but it can be any material that has either a lower coercivity or a higher permeability, or both, than the active layer 122 of the magnetic device 110. In one example, the soft magnetic material is permalloy or supermalloy, such as NiFe, NiFeMo, NiFeCu, NiFeCr, NiFeCuMo, or Fe-TM-B system (TM=IV~VIII group transition metal), such as Fe—Co—Ni—Zr—Ta—B, or Fe—(Al, Ga)—(P, C, B, Si) or Fe—(Co, Ni)—Zr—B, or Fe—(Co, Ni)—(Zr, Nb)—B, or Fe—(Co, Ni)—(Mo, W)—B, or Fe—Si—B, or Fe—Si—B—Nb—Cu, or Fe—Si—B—Nb, or Fe—Al—Ga—P—C—B—Si, or Fe—Co—Si—B—Cu—Nb, or Fe—Co—Ni—S, Co—Nb—Zr, or Fe—Zr—Nb—B, or Hiper50, or sendust, or FeTaC, or Fe—Ta—N—C etc magnetic alloy or magnetic multilayer, such as FeAlN/SiN, with a coercivity of 1~0.001 Oe and a permeability of 500~1,000,000, whereas the active layer 122 is magnetic element, such as Co, Fe, etc with the thickness of around 20~200 angstroms or magnetic alloy, such as CoFe, CoFeB, etc with the thickness of around 20~200 angstroms or magnetic/non-magnetic multilayer, such as CoFe/Ru, Fe/Cr etc, or CMR material, such as LaSrMnO, PrSrCaMnO etc with the thickness of around 50~1000 angstroms with a coercivity of 30~100 Oe and a permeability of 5~100.

In the embodiment of FIG. 1, magnetization of the soft magnetic material 112 is coupled to the active layer 122 of the magnetic device 110 via ferromagnetic RKKY (Ruderman-Kittel-Kasuya-Yosida) coupling. The thin conducting layer 114 therefore consists of a high conductivity metal with a thickness in the range of approximately 12–17 angstroms. Examples of materials that are suitable for the thin conducting layer 114 are Al, Cu, Ag, Au, Ru, Cr, or Ir etc.

The magnetic structure FIG. 1 further includes an electrically conductive structure disposed in proximity to the soft magnetic material 112. The electrically conductive structure includes conducting wire portions 116 and 118 on opposite sides of the soft magnetic material 112. A bidirectional current source 120 is connected (via optional switching circuitry, not shown) to the conducting wires 116 and 118 such that current can flow through the soft magnetic material 112 in either of two opposite directions. In other embodiments, the electrical current need not flow through the soft magnetic material 112. Instead, the electrically conductive structure might flow current alongside or above or below the soft magnetic material 112, so long as current flows in sufficient proximity and at sufficient levels to induce the desired magnetization in the soft magnetic material 112. As the term is used herein, electrical current flow "in proximity" to an element includes, as a special case, electrical current flow "through" the element.

The operation of the structure of FIG. 1 will be described with reference to FIGS. 2A and 2B. These are cross-sectional views of the structure FIG. 1, taken along sight lines 2—2. The writing current does not directly magnetize the active layer 122 of the magnetic device 110. Instead, it magnetizes the soft magnetic material 112, which acts as an intermediary for magnetizing the active layer 122. Referring to FIG. 2A, a writing current is made to flow through the soft magnetic material 112 in a first direction, which is perpendicularly upward from the page. In this case the soft magnetic material 112 becomes magnetized in a direction which, at least near the thin conducting layer 114, is toward the left. If the soft magnetic material 112 is thin enough, then its magnetization is difficult to control by the writing current due to the anisotropy. If the material is thicker, then the magnetization of the material 112 forms a counterclockwise loop within the material 112. For the case of soft magnetic material 112 of 0.1×0.1 µm² size, if its thickness ranges 0.05~0.2 µm, the portion of the material nearest the active layer 122 of the magnetic device 110 is magnetized toward the left.

Because of the ferromagnetic RKKY coupling between the soft magnetic material 112 and the active layer 122 through the thin conducting layer 114, as the writing current reverses the spin of the soft magnetic material 112, the magnetization of the active layer 122 is switched simultaneously to the same direction as the magnetization direction of the nearby portion of the soft magnetic material 112. In the case of FIG. 2A, the active layer 122 becomes magnetized toward the left. It will be appreciated that the magnetic field induced by the current flow through the soft magnetic material 112 might in certain embodiments have some influence in magnetizing the active layer 122 directly, but a feature of the invention is that, if the thin conductive layer 114 has the thickness range of the ferromagnetic RKKY coupling, the magnetization of the soft magnetic material 112 itself also has, an influence in magnetizing the active layer 122. Note that if the thin conductive layer 114 is too thick, the soft magnetic material 112 would lose influence in magnetizing the active layer 122, because the soft magnetic material 112 and the active layer 122 are independent systems. The physical origin herein is the negligible RKKY coupling strength. On the other hand, if the thin conducting layer 114 has the thickness range of 8~12 angstroms, the possibility of antiferromagnetic RKKY coupling between the soft magnetic material 112 and the active layer 122 is very high. This indicates that the magnetizations of the active layer 122 and the soft magnetic material 112 near the thin conducting layer 114 are opposite. However, it is very difficult to control the thickness of the thin conductive layer 114 in the range of antiferromagnetic RKKY coupling. The use of antiferromagnetic RKKY coupling with this invention is therefore not preferred.

If the device is a GMR or MTJ device, once the active layer 122 has become magnetized toward the left, it now has a magnetization direction which is opposite that of the reference layer 126, which has been pinned toward the right. Thus a sense current passing vertically through the magnetic device 110, including both the reference layer 126 and the active layer 122, will experience a relatively high resistance, if the magnetoresistance effect is negative, or a relatively low resistance, if the effect is positive.

If the device is an AMR or CMR device, the active layer 122 has become magnetized toward the left, it now has a permanent magnetization that is toward the left. Thus a sense current passing vertically through the magnetic device 110 will experience a relatively high resistance or a relatively low resistance, dependent on the determination of minor magnetoresistive curve.

In FIG. 2B, if the device is a GMR or MTJ device, a writing current is made to flow through the soft magnetic material 112 in the opposite direction from that of FIG. 2A, i.e., perpendicularly downward into the page. In this case the soft magnetic material 112 becomes magnetized toward the right, at least near the active layer 122. Through RKKY coupling, the magnetization of the soft magnetic material 112 near the active layer 122 also magnetizes the active layer 122 in the same direction. Since the active layer 122 now has the same magnetization direction as the reference layer 126, a sense current passing vertically through the magnetic device 110 will experience a resistance that is lower or higher than that of FIG. 2A for negative or positive magnetoresistance effect, respectively.

If the device is an AMR or CMR device, since the active layer 122 now has the permanent magnetization that is toward the right, a sense current passing vertically through the magnetic device 110 will experience a resistance that is lower or higher than that of FIG. 2A, depending on the minor magnetoresistive loop.

Therefore, it can be seen that the structure of FIG. 1 acts as a memory cell. A digital logic value can be written into the cell by flowing current through the electrically conductive structure in one direction in order to write a value of 0, or the other direction in order to write a value of 1. The value stored in the cell can be read by passing a current through the magnetic device 110 vertically, and measuring the voltage thereby produced across the device 110. A lower voltage indicates a value of 0, and a higher voltage indicates a value of 1 (or vice versa depending on the convention chosen).

As used herein, the terms "vertical", "horizontal", "above", "below", "left" and "right", and other similar terms, refer to dimensions and relative positions as shown in the figures. A physical embodiment, of course, could have a different orientation, and in that case the terms are intended to refer to dimensions and relative positions modified to the actual orientation of the device. For example, even if a physical device like that in FIG. 1 is inverted as compared to the orientation in the figure, the reference layer 126 (FIG. 1) is still considered to be "above" the active layer 122.

As mentioned, the soft magnetic material 112 desirably has a lower coercivity and/or a higher permeability than that of the active layer 122 of the magnetic device 110. If the soft magnetic material 112 has a lower coercivity than that of the active layer 122, then a weaker applied electromagnetic field can be sufficient to switch the magnetization direction of the soft magnetic material 112 than would be required to switch the magnetization direction of the active layer 122. Since the active layer 122 is switched by RKKY coupling and not by the writing current directly, the designer of the magnetic device is free to use a higher coercivity material for the active layer 122. The active layer 122, in the above examples, is chosen herein by the magnetic polarization or the spin-dependent scattering factor for MTJ or GMR or AMR material, respectively. These active layers 122, however, have higher coercivity than the soft magnetic material 112 and lower permeability than soft magnetic material 112. On the other hand, in general, the soft magnetic material 112 has lower polarization and lower spin-dependent scattering factor. Hence, the soft magnetic materials 112 are generally not suitable for use in MTJ or GMR or AMR materials. In CMR devices, because soft magnetic material 112 does not have CMR properties, it cannot be used in CMR devices.

Similarly, if the soft magnetic material 112 has a high permeability, then the magnetic flux lines induced by the writing current are concentrated and amplified within the soft magnetic material 112. If the permeability of the soft magnetic material 112 is higher than that of the active layer 122, then again, less writing current can be sufficient to switch the magnetization direction of the soft magnetic material 112 than would be required to switch the magnetization direction of the active layer 122 directly. Again, since the active layer 122 is switched by RKKY coupling and not by the writing current directly, the designer of the magnetic device is free to use a lower permeability material for the active layer 122.

The ability to use a high permeability material for the soft magnetic material 112 also has another benefit in that because the magnetic flux lines are concentrated within the soft magnetic material 112, an array of memory cells such as that of FIG. 1 can be structured so as to minimize the unintentional influence of the writing current on nearby cells. Cell isolation is thereby improved, as is the stability of the magnetization of an individual cell. For a conventional MRAM design, the writing process is done by introducing x- and y-axis currents simultaneously to produce the magnetic field. However, this field is not concentrated. Nearby cells are always influenced by this field, if the distance between cells is too small. On the other hand, if the magnetic flux of the active layer can't be introduced as a closed path, the active layers of MRAM cells would exist an interaction that is magnetostatic. This interaction would cause to higher switching field and even dependently writing process.

In the embodiment of FIG. 1, the current flow through the soft magnetic material 112 is sufficient to magnetize the soft magnetic material 112 in the desired direction, and the magnetization of the soft magnetic material 112 is sufficient to permanently magnetized the active layer 122 of the magnetic device 110. Permanent magnetization means to increase the magnetization of a material to such a point on the hysteresis curve (typically but not necessarily the saturation point) that the material will retain a non-zero "remanent" magnetization even after complete removal of the externally applied magnetizing energy. Although the magnetization of the soft magnetic material 112 is almost zero after removing the writing current, it would be realigned by the permanent magnetization of the active layer 122 via the RKKY coupling. Hence, the magnetization of the soft magnetic material 112 also becomes permanent. Permanent magnetization of both the soft magnetic material 112 and the active layer 122 results in a bistable device, in which the active layer 122 will retain its magnetization relative to the reference layer 126 even after the current flow through the electrically conductive structure is removed.

Thus, the writing process can be thought of as a sequence of five steps. First, introduce a current into the electrically conductive structure 116 and 118. The amplitude of the writing current is mostly dependent on the permeability value of the soft magnetic material 112 due to the magnetostatic theory expectation. The larger the permeability value is, the smaller the writing current can be. For example if the soft magnetic material 112 is chosen to be NiFeMo, the permeability of which reaches 100,000 and if the coupled system (soft magnetic material 112/thin conductive layer 114/active layer 122) has a saturation field of 10 Oe, the writing current can be in the range from 10 Na to μA. This writing current is much smaller than that of conventional MRAM design, which is on the order of Ma. Second, the current causes a magnetic flux clockwise or counterclockwise, depending on the direction of the current, in the soft magnetic material 112. The magnetic flux can switch the magnetic moment direction along the flux, because the writing current is large enough to rotate all spins of the soft magnetic material 112. Third, the realigned spin direction of the soft magnetic material 112 influences the spins direction of the active layer 122 through the coupling mechanism between the soft magnetic material 112 and the active layer 122. The magnetization direction of the active layer 122 would be the same as that of the soft magnetic material 112 near the thin conductive layer 114. After these steps, the MRAM cell has been completely changed from one logic state to the other. Fourth, since the active layer 122 was written in the third step, the writing current in the soft magnetic material 112 can be removed. The soft magnetic material 112 is a low coercivity and high permeability magnet, so once the current is removed, the clockwise or counterclockwise spin direction would tend toward random. Fifth, however, due to the aligned magnetization of the active layer 122, it would interact with the spins of the soft magnetic material 112 near the thin conductive layer 114 by RKKY coupling. The magnetization of the soft magnetic material 112 near the thin conductive layer 114 would therefore tend to align with the soft magnetic material 112. Based on the lowest energy required, the spin direction of the soft magnetic material 112 would align clockwise or counterclockwise, depending on which direction of the active layer 122 is. This function can increase the magnetic stability due to the lowest magnetic potential energy.

FIGS. 3A and 3B illustrate a variation on the embodiment of FIG. 1, in which the magnetic device 110 constitutes essentially a magneto optic layer 310 as the active layer of the device. The magnetization induced in the soft magnetic material 112 by the writing current is coupled into the magneto optic layer 310 by RKKY coupling as in the embodiment of FIGS. 1, 2A and 2B, and reading of the value in the cell is accomplished by evaluating polarized light reflected off the magneto optic layer 310 of the cell. If the magneto optic material 310 is magnetized in the same direction as oncoming polarized light, as in FIG. 3A, then a high Kerr voltage is experienced and the reflected light has a particular plane of polarization. If the magneto optic material 310 is magnetized in the opposite direction as the oncoming polarized light, as in FIG. 3B, then a lower Kerr voltage is experienced and the reflected light has a different plane of polarization. Thus the plane of polarization of the reflected light is sensed in order to determine the value in the cell.

FIG. 4 is a symbolic diagram of another magnetic structure incorporating features of the invention. It is similar to that of FIG. 1, except there is no thin conducting layer 114 between the soft magnetic material 112 and the active layer 122 of the magnetic device 110. In this case the magnetization directions of the soft magnetic material 112 and the active layer 122 are coupled with each other via exchange coupling rather than RKKY coupling. Nevertheless, the writing current flowing through the electrically conductive structure including wires 116 and 118 will simultaneously change both magnetizations: the change in magnetization of the soft magnetic material 112 is induced by the magnetic field created by the current flow, and the change in magnetization of the active layer 122 occurs because that layer is exchanged coupled with the soft magnetic material 112.

The operation of the embodiment of FIG. 4 is similar to that of FIG. 1. As with the embodiments of FIG. 1 and FIG. 4, the magnetic device 110 can be any device that exploits the dependence of a physical property on relative magnetization direction, including but not limited to AMR, CMR, GMR and MTJ memory cells. The main difference between these two embodiments is the kind of coupling that exists between the soft magnetic material 112 and active layer 122. If RKKY coupling, the magnetic properties of the active layer 122 can not be change greatly. Hence, the conventional MTJ or GMR or AMR or CMR material or magneto optical material can be used as the magnetic device 110 in the embodiment of FIG. 1. However, if exchange coupling, the magnetic properties, including the coercivity, of the active layer 122 would be changed by the soft magnetic material 112, the chosen of the active layer 122 can be the one with higher coercivity. Thus, the choice of the best kind of coupling to use between the soft magnetic material 112 and the active layer 122 depends on how large the coercivity is of the active layer 122.

Figure 5:
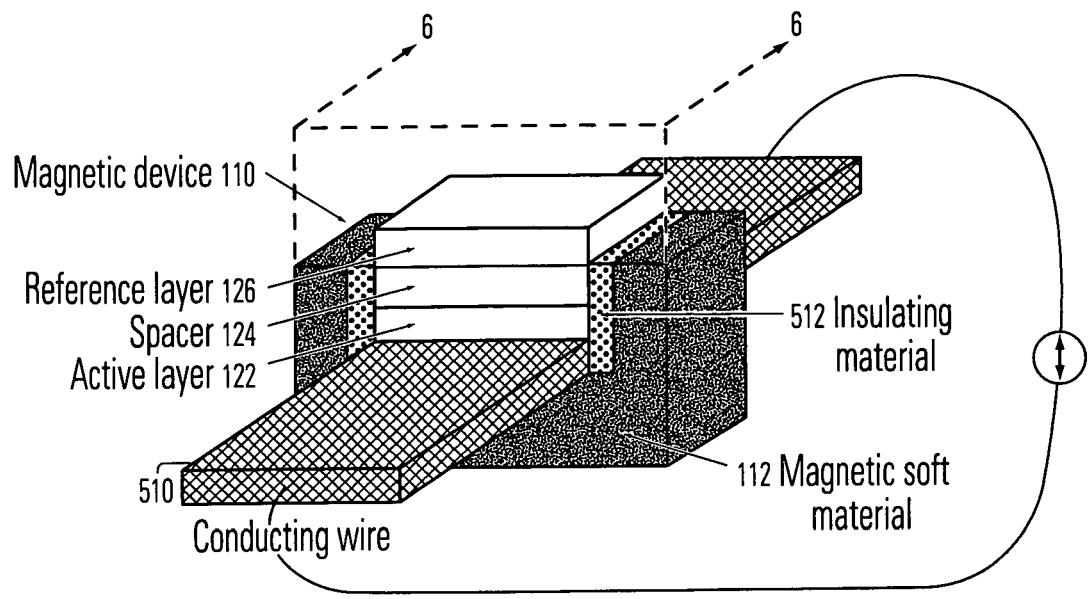

FIG. 5 is a symbolic diagram of yet another magnetic structure incorporating features of the invention. In FIG. 5, the soft magnetic material 112 is coupled to the active layer 122 of the magnetic device 110 magnetically rather than quantum mechanically. That is, coupling is achieved because the magnetic flux lines produced by a magnetized soft magnetic material 112 form a loop that passes longitudinally (horizontally) through the active layer 122. In the embodiment shown, the soft magnetic material 112 is U-shaped. The base of the U is disposed below the magnetic device 110, and the two arms of the U extend vertically upward on opposite sides of at least the active layer 122 of the magnetic device 110. The base of the U is spaced from the active layer 122 by the conducting wire 510, which in the embodiment of FIG. 5, passes above the base of the U rather than through it. The two arms of the U are each spaced from the magnetic device 110 by a respective insulating material 512. The insulating material 512 has a width that is much smaller than that of the soft magnetic material in the dimension parallel to the base of the U. In operation, the writing current passing through the conducting wire 510 induces a strong magnetic field in the high permeability soft magnetic material 112. The two poles of the now-magnetized soft magnetic material 112 are disposed at the arms of the U, and a magnetic flux loop is completed by lines of flux passing through the active layer 122 of the magnetic device 110. The materials and dimensions are chosen such that the parallel magnetic field in the active layer 122 is sufficient to change the magnetization orientation of the layer. Again, although the magnetic field induced by the writing current in conducting wire 510 may provide some assistance in magnetizing the active layer 122 in the desired direction, the primary influence on the magnetization direction is completion of the magnetic flux loop of the now-magnetized U-shaped soft magnetic material 112.

Figure 6A:
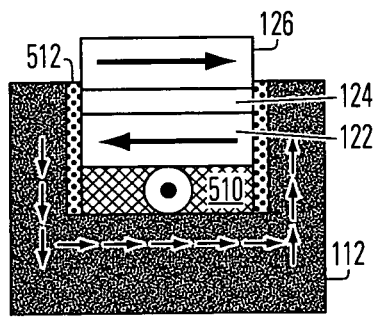
FIGS. 6A and 6B are cross-sectional views of the structure of FIG. 5, taken along sight lines 6—6.
Figure 6B:
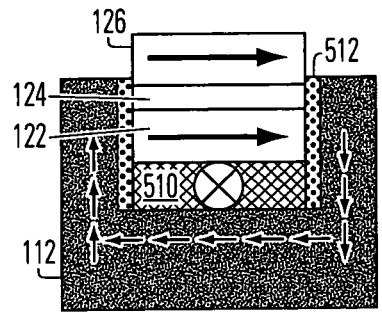
Figure 7A:
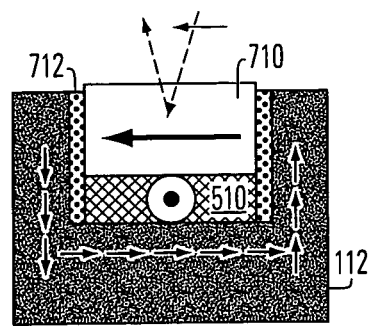
FIGS. 7A and 7B illustrate a variation on the magnetic structure of FIG. 5, also taken along sight lines 6—6 of FIG. 5.
Figure 7B:
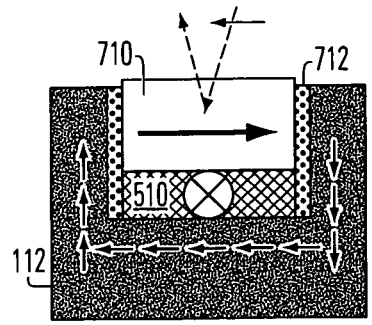

FIGS. 6A and 6B are cross-sectional views of the structure of FIG. 5, taken along sight lines 6—6. Referring to FIG. 6A, a writing current is made to flow through the wire 510 in a direction that is perpendicularly upward from the page. In this case the soft magnetic material 112 becomes magnetized in a counterclockwise direction. Because the arms of the U-shaped material 112 terminate on opposite sides of the active layer 122 of the magnetic device 110, and the active layer 122 is a magnetic material, the flux loop of the now-magnetized soft magnetic material 112 passes horizontally leftward through the active layer 122 of the magnetic device 110. Thus the magnetization direction of the active layer 122 is switched to the leftward direction at the same time that the magnetization of the soft magnetic material 112 is switched to a clockwise direction. Again, it will be appreciated that the magnetic field induced by the current flow through the electrically conducting structure 510 might in certain embodiments have some influence in magnetizing the active layer 122 directly, but a feature of the invention is that the magnetization of the soft magnetic material 112 itself also has an influence in magnetizing the active layer 122. Once the active layer 122 has become magnetized toward the left, for GMR and MTJ devices, it now has a magnetization direction which is opposite that of the reference layer 126, which has been pinned toward the right. Thus a sense current passing vertically through the magnetic device 110, including both the reference layer 126 and the active layer 122, will experience a relatively high or low resistance for the negative or positive magnetoresistance effect, respectively. For AMR and CMR devices, it now has a permanent magnetization that is toward the left. Thus a sense current passing vertically through the magnetic device 110 will experience a relatively high or low resistance, depending on the minor magnetoresistive loop.

In FIG. 6B, a writing current is made to flow through the wire 510 in a direction perpendicularly downward into the page. In this case the soft magnetic material 112 becomes magnetized in a clockwise direction, inducing parallel magnetic flux lines in the rightward direction through the active layer 122. The materials and dimensions of the magnetic device 110 are chosen so that these flux lines are sufficient to magnetize the active layer 122 toward the right. For GMR and MTJ devices, since the active layer 122 now has the same magnetization direction as the reference layer 126, a sense current passing vertically through the magnetic device 110 will experience a resistance that is lower or higher than that of FIG. 6A for the negative or positive magnetoresistance effect, respectively. For AMR and CMR devices, the active layer 122 now has the permanent magnetization that is toward the right, a sense current passing vertically through the magnetic device 110 will experience a resistance that is lower or higher than that of FIG. 6A, depending on minor magnetoresistive loop.

In the embodiments of FIGS. 5, 6A and 6B, the arms of the U of soft magnetic material 112 extend upward past the top surface of active layer 122 of the magnetic device 110. The exact upward termination position of these arms is not critical as long as the magnetization direction of active layer 122 is changed more easily than that of the reference layer 126, given the structure of the device. The writing current in the conducting wire 510 is sufficient to magnetize the soft magnetic material 112 to a level that induces a magnetic field through the active layer 122, that is in turn sufficient to set the magnetization direction of that layer, but the level of magnetization of the soft magnetic material 112 is not sufficient to change the magnetization direction of the reference layer 126.

As with FIGS. 3A and 3B, FIGS. 7A and 7B illustrate a variation on the embodiment of FIG. 5 in which the magnetic device 110 constitutes essentially a magneto optic layer 710 as the active layer of the device. The magnetization direction induced in the soft magnetic material 112 by the writing current is coupled into the magneto optic layer 710 by completing the clockwise or counterclockwise magnetic flux loop in the soft magnetic material 112, as in the embodiment of FIGS. 5, 6A and 6B. Reading of the value in the cell is accomplished by evaluating polarized light reflected off the magneto optic layer 710 of the cell. If the magneto optic material 710 is magnetized in the same direction as oncoming polarized light, as in FIG. 7A, then a high Kerr voltage is experienced and the reflected light has a particular plane of polarization. If the magneto optic material 710 is magnetized in the opposite direction as oncoming polarized light, as in FIG. 7B, then a lower Kerr voltage is experienced and the reflected light has a different plane of polarization. The plane of polarization of the reflected light is a sensed in order to determine the value in the cell.

FIGS. 8A, 8B and 8C (collectively FIG. 8) are schematic diagrams of an electrical connection scheme that can be used for reading from and writing-to a single cell magnetic memory incorporating features of the invention. The scheme is the same in all three diagrams, and other electrical connection schemes can be used instead if desired. FIG. 8D is a key defining certain symbols used in FIGS. 8A, 8B and 8C. FIG. 8A illustrates the use of the electrical connections for writing a first value into the cell, FIG. 8B illustrates the use of the electrical connections for writing a second (opposite) value into the cell, and FIG. 8C illustrates the use of the electrical connections for reading the value in the cell.

Referring to FIG. 8A, the magnetic structure comprises the magnetic device 810 having top and bottom electrical terminals. The bottom terminal is connected to the top terminal of soft magnetic material 812, and the top terminal of magnetic device 810 is connected to the cathode of a diode 814. The anode of the diode 814 is connected to a first horizontal line (conductor) 816. The symbol for the soft magnetic material 812 shown in FIG. 8 includes both the material itself and the electrically conductive structure for writing a value into the cell, so as not to make a distinction between embodiments in which the writing current flows through the soft magnetic material and embodiments in which the writing current flows nearby the soft magnetic material. Thus the electrically conductive structure has a left terminal 830 connected to one of the current path terminals 818 of a selection transistor 820, the other current path terminal of which 822, is connected to a first vertical line 824. The gate of transistor 820 is connected to a second horizontal line 826, and the right hand terminal 832 of the electrically conductive structure for soft magnetic material 812 is connected to a second vertical line 828.

The magnetic device 810 can be any magnetic device whose electrical resistance depends on the relative magnetization direction of the device. In the embodiment of FIG. 8, the magnetic device 810 is an MTJ. In other embodiments, the magnetic device 810 can for example be a GMR device or an AMR device or a CMR device. In addition, the diode 814 can be deposited directly on the magnetic device 810, thereby minimizing the chip area required for the cell. The soft magnetic material 812 can be either a film of material disposed below the magnetic device 810, as in FIGS. 1 and 4, or it can be a U-shaped structure as in FIG. 5. If it is structured as in FIG. 1, and the active layer of the magnetic device 810 is RKKY-coupled to the soft magnetic material 812, then a thin conducting layer 114 (not shown in FIG. 8) is disposed between the soft magnetic material 812 and the magnetic device 810. If it is structured as in FIG. 4, and the active layer of the magnetic device 810 is exchange coupled to the soft magnetic material 812, then no such thin conducting layer 114 is included. In either the case of FIG. 1 or the case of FIG. 4, the current path between the left and right hand terminals of the electrically conductive structure passes through the soft magnetic material itself. If the soft magnetic material 812 is U-shaped as in FIG. 5, then insulating spacing material 512 (not shown in FIG. 8) is included. The active layer of the magnetic device 810 is coupled magnetically to the soft magnetic material 812, and the current path between the left and right terminals of the electrically conductive structure, as shown in the schematic diagrams of FIG. 8, passes between the soft magnetic material 812 and the active layer of the magnetic device 810 rather than passing through the soft magnetic material 812 itself.

FIG. 8A illustrates the operation of the circuit for writing a first value into the magnetic device 810. In this case the vertical line 828 is held at a low voltage, and the horizontal line 826 is held at a voltage higher than the turn-on threshold voltage. This turns on transistor 820. A high-going voltage pulse is then introduced on vertical line 824. This creates a current flow through the current path terminals 822 and 818 of the transistor 820, and through the electrically conductive structure for soft magnetic material 812 from left to right. The soft magnetic material 812 bus becomes magnetized in a first direction, and by whatever coupling mechanism is used in the given embodiment, that magnetization causes the active layer of magnetic device 810 to become magnetized in the same direction. After the voltage pulse on vertical line 824 is removed, the active layer of magnetic device 810 retains a magnetization direction that is either the same as or opposite that of the reference layer of magnetic device 810, according to the direction of the writing current flow.

FIG. 8B illustrates the operation of the circuit for writing a second value, opposite the first value, into the magnetic device 810. As for the sequence in FIG. 8A, in FIG. 8B, the horizontal line 826 is kept at a voltage which is higher than one voltage threshold above the gate turn on voltage mentioned above. Both vertical lines 824 and 828 are pulsed to the same high voltage level, but the pulse on line 828 remains at the high voltage level for longer than the pulse on vertical line 824. During the extended duration of the pulse on vertical line 828, current flows through the electrically conductive structure for soft magnetic material 812 toward the left, thereby magnetizing the soft magnetic material 812 in an appropriate direction and indirectly magnetizing the active layer of magnetic device 810 in the direction opposite that caused by the sequence of FIG. 8A. After both voltage pulses are removed, the active layer of magnetic device 810 retains a magnetization direction that is opposite the direction that was retained in FIG. 8A.

FIG. 8C illustrates the operation of the circuit for reading the value stored in the magnetic device 810. The voltage of horizontal line 826 is again held at a voltage which is more than one threshold mentioned above, and a high going voltage pulse is introduced onto horizontal line 816. Current from line 816 passes through the forward biased diode 814 and the magnetic device 810, then leftward through the electrically conductive structure for soft magnetic material 812 and the transistor 820, and out the vertical line 824. A high-going voltage pulse is introduced also on the vertical line 828 concurrently with the pulse on horizontal line 816, in order to ensure that the reading current will flow leftward and out vertical line 824 rather than rightward and out vertical line 828. As the read current flow passes through the magnetic device 810, it will experience a resistance that depends on whether the active layer of the device is magnetized in the same direction or the opposite direction relative to the reference layer of the device. The sequence of FIG. 8A magnetized the active layer in one of the two directions, whereas the sequence of FIG. 8B magnetized the active layer in the other of these two directions. Thus by observing the voltage drop through the cell experienced by the reading current of FIG. 8C, a sense amplifier can determine whether the magnetic device 810 was storing a logic 1 or logic zero.

Here, it is noted that the current amplitude of reading process is much smaller than that of writing process. Thus, the reading current will not unintentionally change the logic value stored in the cell. Again, the reading current depends on both the permeability value of the soft magnetic material 812 and the sensitivity of the sense amplifier. For example 1 mentioned above in which the soft magnetic material 812 has a permeability value of 100,000, the reading current can be in the range of around Na~100 Na. This would cause a voltage signal output of on the order of Mv for the resistance of the magnetic device 810 of 10 kΩ. However, for example 2 in which the chosen permeability value of the soft magnetic material 812 is 1,000, the writing current might be in the range of 1 µA~100 µA, and the reading current might be in the range of 100 Na~10 μA. For the same magnetic device 810 as above, the output signal voltage is around 100 Mv~V, which is easily treated by the sense amplifier.

The memory cell of FIG. 8 can be replicated into a larger array of rows and columns in order to form a memory cell array. In one embodiment, all the cells in a column, and only those cells, share left and right vertical lines 824 and 828. Similarly, all cells in a row, and only those cells, share top and bottom horizontal lines 816 and 826.

Figure 9:
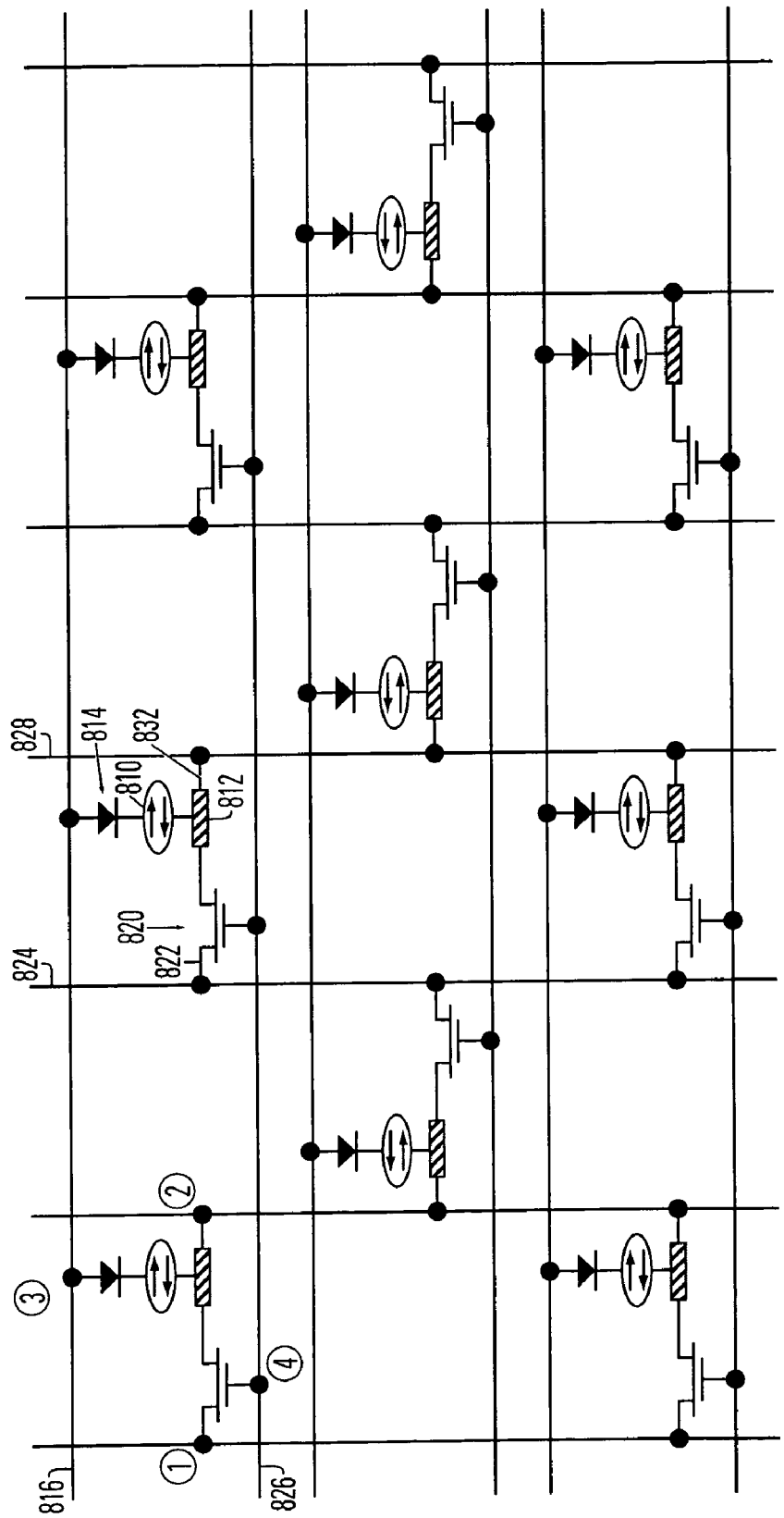
FIG. 9 illustrates an array incorporating features of the invention.

FIG. 9 illustrates another array embodiment in which the cells in alternating rows are offset horizontally such that each cell in every second row is disposed horizontally between the right hand vertical line of the cell above and to the left, and the left hand vertical line of the cell above and to the right. In addition, the cells in every second row are mirrored about a vertical axis such that the current path terminal 822 of transistor 820 for each given cell in a "normal" a row shares vertical line 824 with the corresponding terminal of the corresponding transistor in the cell below and to the left of the given cell. Also, the opposite terminal 832 of the electrically conductive structure for soft magnetic material 812 for each given cell in a "normal" row shares vertical line 828 with the corresponding terminal in the cell below and to the right of the given cell. The Sharing of one horizontal or vertical line reduces the total device area by one line width in the horizontal or vertical direction, respectively, enabling a greater packing density for the same number of cells.

FIGS. 10A and 10B illustrate magnetic structures incorporating features of the invention. The soft magnetic material 112 herein is the same as that of FIG. 1 and 4. As discussed above, the aspect ratio (ratio of height to width) of the soft magnetic material 112 is near or larger than unity. After completion of the 5 steps of the writing process as described above, the spins in the soft magnetic material 112 are self-enclosed to minimize the magnetic energy. The direction of magnetization is annular about the direction of the previous current flow. This results in stable magnetization of the active layer after addressing the magnetic device 110. The embodiment of FIG. 10A includes a thin conducting layer 114 as in the embodiment of FIG. 1, such that the magnetization direction near the top surface of the soft magnetic material 112 is coupled to the active layer 122 of the magnetic device 110 via RKKY coupling. The embodiment of FIG. 10B, like the embodiment of FIG. 4, does not include the thin conducting layer 114. Thus the magnetization direction near the top surface of the soft magnetic material 112 is coupled to the active layer 122 via exchange coupling. In the embodiment of FIG. 5, the spins in the soft magnetic material 112 form a closed loop (through the active layer 122) regardless of the thickness of the bottom of the U, as long as the soft magnetic material 112 has high permeability. In this case the magnetization stability of the active layer 122 of the magnetic device 110 is better than that of either of FIGS. 10A and 10B due to the absence of magnetic edge effect.

The devices illustrated in and discussed above are capable of many variations. FIGS. 11A and 11B illustrated one of such variations, in which the layers of the magnetic device form rings that encircle the soft magnetic material. In particular, the soft magnetic material 1112 is encircled by a magnetic device 1110, which in the embodiments of FIGS. 11A and 11B includes a hard layer 1126 acting as the reference layer, and a soft layer 1122 acting as the active layer, separated by a spacer layer 1124 which may be electrically insulating for an MTJ or conductive for a GMR device. If the device is an AMR device or a CMR device, the spacer layer 1124 and hard layer 1126 are absent. In an embodiment which uses RKKY coupling to couple the magnetization direction from the soft magnetic material 1112 to the soft layer 1122, the rings of the magnetic device 1110 are spaced from the soft magnetic material 1112 by an inner concentric ring 1114 of thin conducting material. In an embodiment that uses exchange coupling to couple the magnetization direction from the soft magnetic material 1112 to soft layer 1122, the inner concentric ring 1114 is omitted. However, because the current is shunted by the soft magnetic material 1112 during the reading process and by the magnetic device 1110 during the writing process, both reading and writing effects of this MRAM would be poor, compared to the embodiments of FIG. 1, FIG. 4, and FIG. 5.

In operation, for GMR devices or MTJ devices, a writing current is injected into the soft magnetic material 1112 such that it flows through the center of the rings in either of the two axial directions. If current flows in one direction, as shown in FIG. 11A, then the soft layer 1122 of the magnetic device 1110 becomes magnetized in a counterclockwise direction around the ring—which is the same direction as the magnetization of the hard layer 1126. If current flows in the opposite direction, as shown in FIG. 11B, then the soft layer 1122 of the magnetic device 1110 becomes magnetized in a clockwise direction around the ring—which is the opposite direction from the magnetization of hard layer 1126. Reading of the value in the structure of FIGS. 11A and 11B is similar to the process of reading the value in the magnetic devices in other structures described herein, in that the device will exhibit a higher electrical resistance to current passing vertically through the device when the soft layer 1122 is magnetized oppositely (identically) to that of the hard layer 1126, than if the soft layer is magnetized in the same (opposite) direction as that of the hard layer 1126 for the negative (positive) magnetoresistance effect. On the other hand, for AMR devices or CMR devices, the control of the magnetization direction of active layer 1122 by the soft magnetic material 1112 with whatever coupling mechanism, including ferromagnetic RKKY coupling and exchange coupling, can also present the different resistance level. However, as discussed above, the reading current must be made to flow through both the soft magnetic material 1112 and the magnetic device 1110. It is very difficult to design this independent current flow path. In the reading process, since the soft magnetic material 1112 and the magnetic device 1110 form a parallel circuit, the current introduced into the magnetic device 1110 depends on what the resistance ratio is between the soft magnetic material 1112 and the magnetic device 1110. On the other hand, in the writing process, the current flowing in the soft magnetic material 1112 also depends on the resistance ratio between the magnetic device 1110 and the soft magnetic material 1112. In a word, the optimum resistance candidate of the soft magnetic material 1112 for both the reading and writing processes is the same as that of the magnetic device 1110. If the magnetic device 1110 is an MTJ in which the resistance results from the tunneling effect, the soft magnetic material 1112 preferably is a magnetic ceramic, such as $(MnO)_x(Fe_2O_3)_{1-x}$, $(ZnO)_x(Fe_2O_3)_{1-x}$, $(MnO)_x(ZnO)_y(Fe_2O_3)_{1-x-y}$, or $(NiO)_x(Fe_2O_3)_{1-x}$ etc or magnetic oxide, or nitride, such as Fe—Hf—(O, N), Fe—Si—Al—(Ti, Ta)—(O, N), Fe—Hf—C—N, Fe—Co—Ni—N, Fe—Cr—O, Fe—(Cu, Rh)—Cr—O etc or magnetic multilayer, such as $FeTaN/FeTaN_{rich}$, (Co, Fe)SiO/SiO. If the magnetic device 1110 is a GMR material or an AMR material or a CMR material, then the soft magnetic material 1112 is preferably the same as that of FIG. 1, FIG. 4, or FIG. 5.

It can be seen that the structures described herein require a lower writing current than conventional memory structures because of the high permeability of the soft magnetic material used as an intermediary for setting the direction of magnetization of the active layer of the magnetic device. The uniaxial magnetic field used in the embodiment of FIGS. 1, 4, and 5 provides maximum gain of the magnetic field for writing a value into the magnetic device 110. In addition the high magnetization stability that can be achieved in the embodiments described herein can help isolate the magnetic structure from other nearby cells in an array.

As used herein, a given event or value is "responsive" to a predecessor event or value if the predecessor event or value influenced the given event or value. If there is an intervening processing element, step or time period, the given event or value can still be "responsive" to the predecessor event or value. If the intervening processing element or step combines more than one event or value, the signal output of the processing element or step is considered "responsive" to each of the event or value inputs. If the given event or value is the same as the predecessor event or value, this is merely a degenerate case in which the given event or value is still considered to be "responsive" to the predecessor event or value. "Dependency" of a given event or value upon another event or value is defined similarly.

The foregoing description of preferred embodiments of the present invention has been provided for the purposes of illustration and description. It is not intended to be exhaustive or to limit the invention to the precise forms disclosed. Obviously, many modifications and variations will be apparent to practitioners skilled in this art. The embodiments were chosen and described in order to best explain the principles of the invention and its practical application, thereby enabling others skilled in the art to understand the invention for various embodiments and with various modifications as are suited to the particular use contemplated. It is intended that the scope of the invention be defined by the following claims and their equivalents.

The invention claimed is:

1. Magnetic memory cell apparatus comprising:
   first, second and third electrical conductors;
   a first conductive path for carrying current flow bidirectionally between the first and second conductors;
   a first magnetic material in magnetic communication with the first conductive path, the first magnetic material being magnetizable in first or second different magnetic material directions, selectably in response to current flow in first or second opposite current flow directions, respectively, in the first conductive path;
   a magnetic device having an active layer of magnetic material disposed relative to the first magnetic material such that the active layer is magnetizeable in first or second different active layer directions, at least partially in response to magnetization of the first magnetic material in respectively the first or second magnetic material directions, the magnetic device further having a fixed magnetic layer parallel to the active layer;
   a second conductive path for carrying a sense current between the third conductor and the first conductor, serially through both the fixed magnetic layer and the active layer of the magnetic device.

2. Apparatus according to claim 1, wherein the first conductive path carries current switchably between the first and second conductors.

3. Apparatus according to claim 1, wherein the first conductive path is disposed to flow the current alongside the first magnetic material.

4. Apparatus according to claim 1, wherein the first conductive path is such as to flow the current within the first magnetic material.

5. Apparatus according to claim 1, wherein the first conductive path includes a first portion for carrying current flow between the first magnetic material and the first conductor,
   and wherein the second conductive path shares the first portion with the first conductive path.

6. Apparatus according to claim 5, wherein the first portion of the first conductive path includes a cell selection switch.

7. Apparatus according to claim 5, wherein the second conductive path includes a diode not in the first portion of the first conductive path.

8. Apparatus according to claim 1, wherein the magnetic device is a member of the group consisting of an anisotropic magnetoresistive device, a colossus magnetoresistive device, a giant magnetoresistive device and a magnetic tunnel junction device.

9. Apparatus according to claim 1, wherein the active layer is coupled to the first magnetic material quantum mechanically.

10. A structure according to claim 1, wherein the active layer is coupled to the first magnetic material magnetostatically.

11. A magnetic memory array apparatus comprising a first plurality of memory cells arranged electrically in rows and columns, all cells in the first plurality that are arranged in a given column sharing first and second column conductors, and all cells in the first plurality that are arranged in a given row sharing a first row conductor, wherein each given cell in the first plurality comprises:
   a respective first conductive path for carrying current flow bidirectionally between the first and second conductors to which the given cell is connected;
   a respective first magnetic material in magnetic communication with the first conductive path of the given cell, the first magnetic material being magnetizable in first or second different magnetic material directions, selectably in response to current flow in first or second opposite current flow directions, respectively, in the first conductive path of the given cell;
   a respective magnetic device having a respective active layer of magnetic material disposed relative to the first magnetic material of the given cell such that the active layer is magnetizable in first or second different active layer directions, at least partially in response to magnetization of the first magnetic material of the given cell in respectively the first or second magnetic material directions, the magnetic device further having a fixed magnetic layer parallel to the active layer;
   a respective second conductive path for carrying a sense current between the third and first conductors to which the given cell is connected, serially through both the fixed magnetic layer and the active layer of the magnetic device of the given cell.

12. Apparatus according to claim 11, wherein the first conductive path of each given one of the cells in the first plurality includes a respective first portion for carrying current flow between the first magnetic material and the first conductor of the given cell, and wherein the second conductive path of the given cell shares the first portion with the first conductive path of the given cell.

13. Apparatus according to claim 12, wherein the first portion of the first conductive path of each given cell in the first plurality includes a respective cell selection switch.

14. Apparatus according to claim 12, wherein the second conductive path of each given cell in the first plurality includes a respective diode not in the first portion of the first conductive path of the given cell.

15. Apparatus according to claim 12, wherein the first portion of the first conductive path of each given cell in the first plurality includes a respective cell selection switch, each of the cell selection switches having a respective control terminal, wherein all cells in the first plurality that are arranged in a given row share a second row conductor connected to the control terminals of all of the cell selection switches in the given row.

16. Apparatus according to claim 11, further comprising a second plurality of memory cells arranged electrically in rows and columns, the rows of the second plurality of memory cells being interleaved with the rows of the first plurality of memory cells, all cells in the second plurality that are arranged in a particular column of the second plurality sharing the first column conductor with the cells in a particular column of the first plurality, all cells in the second plurality that are arranged in the particular column of the second plurality sharing the second column conductor with the cells in a column of the first plurality that is adjacent the particular column of the first plurality, and all cells in the second plurality that are arranged in a particular row sharing a respective row conductor, wherein each particular cell in the second plurality comprises:

a respective first conductive path for carrying current flow bidirectionally between the first and second conductors to which the particular cell is connected;

a respective first magnetic material in magnetic communication with the first conductive path of the particular cell, the first magnetic material being magnetizable in first or second different magnetic material directions, selectably in response to current flow in first or second opposite current flow directions, respectively, in the first conductive path of the particular cell;

a respective magnetic device having a respective active layer of magnetic material disposed relative to the first magnetic material of the particular cell such that the active layer is magnetizable in first or second different active layer directions, at least partially in response to magnetization of the first magnetic material of the particular cell in respectively the first or second magnetic material directions, the magnetic device further having a fixed magnetic layer parallel to the active layer;

a respective second conductive path for carrying a sense current between the third and first conductors to which the particular cell is connected, serially through both the fixed magnetic layer and the active layer of the magnetic device of the particular cell; and a respective second conductive path for carrying a sense current between the third and first conductors to which the particular cell is connected, through the active layer of the magnetic device of the particular cell.

17. Apparatus according to claim 16, wherein the first conductive path of each particular one of the cells in the second plurality includes a respective first portion for carrying current flow between the first magnetic material and the first conductor of the particular cell, wherein the second conductive path of the particular cell shares the first portion with the first conductive path of the particular cell and wherein the first portion of the first conductive path of each particular cell in the second plurality includes a respective cell selection switch, each of the cell selection switches in the second plurality having a respective control terminal, and wherein all cells in the second plurality that are arranged in a particular row share a second row conductor connected to the control terminals of all of the cell selection switches in the particular row in the second plurality.

18. A magnetic memory array apparatus comprising a first plurality of memory cells arranged electrically in rows and columns, such that all cells in the first plurality that are arranged in each given column share respective first and second column conductors, and all cells in the first plurality that are arranged in each given row share a respective row conductor, wherein each given cell in the first plurality comprises:

a respective electrically conductive structure for carrying current flow bidirectionally between the first and second column conductors to which the given cell is connected;

a respective magnetic device having a respective active layer of magnetic material which is magnetizable in first or second different active layer directions, selectably in response to current flow in first or second opposite current flow directions, respectively, in the electrically conductive structure of the given cell, each of the magnetic devices further having a respective fixed magnetic layer parallel to the active layer; and a cell selection mechanism which, when selected, permits current flow through only selected ones of the electrically conductive structures, the cell selection mechanism blocking current flow through unselected ones of the electrically conductive structures, the cell selection mechanisms for all the cells which are arranged in each given row being responsive to the row conductor of the given row;

wherein application of a voltage difference across the first and second column conductors to which the cells in the first plurality are connected magnetizes in a common one of the active layer directions, the active layer of magnetic material in all cells in the first plurality which are selected by the cell selection mechanism, and leaves unchanged any magnetization of the active layer of magnetic material in all cells in the first plurality which are unselected by the respective cell selection mechanism, and wherein no two adjacent cells in the first plurality which share a row conductor also share a column conductor.

19. A magnetic memory array apparatus comprising a first plurality of memory cells arranged electrically in rows and columns, all cells in the first plurality that are arranged in a given column sharing first and second column conductors, wherein each given cell in the first plurality comprises:

a respective electrically conductive structure for carrying current flow bidirectionally between the first and second column conductors to which the given cell is connected;

a respective magnetic device having a respective active layer of magnetic material which is magnetizable in first or second different active layer directions, selectably in response to current flow in first or second opposite current flow directions, respectively, in the electrically conductive structure of the given cell, each of the magnetic devices further having a respective fixed magnetic layer parallel to the active layer; and a cell selection mechanism which, when selected, permits current flow through only selected ones of the electrically conductive structures, the cell selection mechanism blocking current flow through unselected ones of the electrically conductive structures;

wherein application of a voltage difference across the first and second column conductors to which the cells in the first plurality are connected magnetizes in a common one of the active layer directions, the active layer of magnetic material in all cells in the first plurality which are selected by the cell selection mechanism, and leaves unchanged any magnetization of the active layer of magnetic material in all cells in the first plurality which are unselected by the respective cell selection mechanism, wherein each given cell in the first plurality further comprises a respective intermediary magnetic material in magnetic communication with the electrically conductive structure of the given cell, the intermediary magnetic material being magnetizable in first or second different intermediary directions, selectably in response to current flow in the first or second opposite current flow directions, respectively, in the electrically conductive structure of the given cell, and wherein the intermediary magnetic material of each given cell in the first plurality is disposed relative to the active layer of the respective cell such that the magnetization of the active layer of the given cell occurs at least partially in response to magnetization of the intermediary magnetic material of the given cell.

20. Apparatus according to claim 19, wherein the intermediary magnetic material of each given cell in the first plurality is disposed relative to the active layer of the respective cell such that the magnetization of the active layer of the given cell occurs at least partially in response to quantum-mechanical coupling of the magnetization of the intermediary magnetic material of the given cell to the active layer of the given cell.

21. Apparatus according to claim 19, wherein the intermediary magnetic material of each given cell in the first plurality is spaced from the intermediary magnetic material of all immediate neighboring cells in the magnetic memory array.

22. Apparatus according to claim 19, wherein the electrically conductive structure of each given cell in the first plurality is isolated electrically from the intermediary magnetic material of the given cell.

23. Apparatus according to claim 19, wherein the electrically conductive structure of each given cell in the first plurality flows current within the intermediary magnetic material of the given cell.

24. Apparatus according to claim 19, wherein the intermediary magnetic material has a first coercivity and a first permeability, wherein the active layer has a second coercivity and a second permeability, and wherein either the second coercivity exceeds the first coercivity, or the second permeability is less than the first permeability, or both.

25. Apparatus according to claim 19, wherein the cell selection mechanism comprises a respective transistor in each given cell in the first plurality, the transistors each having first and second current path terminals connected in series in the electrically conductive structure of the given cell, the transistors each further having a respective control terminal for receiving a respective signal for turning on the transistors in only the selected ones of the electrically conductive structures.

26. Apparatus according to claim 25, further comprising a plurality of row conductors, wherein the control terminals of the transistors in all cells in the first plurality that are arranged in each given row are connected to a respective one of the row conductors.

27. Apparatus according to claim 19, further comprising a plurality of read conductors, wherein each given one of the cells in the first plurality further comprises a respective second conductive path for carrying a sense current between one of the read conductors and one of the column conductors to which the given cell is connected, serially through both the fixed magnetic layer and the active layer of the magnetic device of the given cell.

28. A structure according to claim 19, wherein the magnetic device comprises a member of the group consisting of a giant magnetoresistive device, a magnetic tunnel junction device, an anisotropic magnetoresistive device, a colossus magnetoresistive device, and a magneto-optical device.

29. A magnetic memory array apparatus comprising a first plurality of memory cells arranged in an array, wherein each given cell in the first plurality comprises:

a respective electrically conductive structure;

a region of intermediary magnetic material in magnetic communication with the electrically conductive structure, the region of intermediary magnetic material being magnetizable in first or second different magnetic material directions, selectably in response to current flow in first or second different current flow directions, respectively, in the electrically conductive structure; and a magnetic device having an active layer of magnetic material disposed relative to the region of intermediary magnetic material such that the active layer is magnetizable in first or second different active layer directions, at least partially in response to the magnetization direction of the region of intermediary magnetic material, wherein the region of intermediary magnetic material in each of the memory cells in the first plurality is separated magnetically from the region of intermediary magnetic material in all neighboring ones of the memory cells in the first plurality.

30. Apparatus according to claim 29, wherein the region of intermediary magnetic material in each of the memory cells in the first plurality farther is separated electrically from the region of intermediary magnetic material in all neighboring ones of the memory cells in the first plurality.

31. Apparatus according to claim 29, wherein the magnetic device is a member of the group consisting of an anisotropic magnetoresistive device, a colossus magnetoresistive device, a giant magnetoresistive device and a magnetic tunnel junction device.

32. A magnetic memory array apparatus comprising a first plurality of memory cells arranged in an array, wherein each given cell in the first plurality comprises:

a respective electrically conductive structure;

a region of intermediary magnetic material in magnetic communication with the electrically conductive structure, the region of intermediary magnetic material being magnetizable in first or second different magnetic material directions, selectably in response to current flow in first or second different current flow directions, respectively, in the electrically conductive structure, the intermediary magnetic material having a first coercivity and a first permeability; and a magnetic device having an active layer of magnetic material disposed relative to the region of intermediary magnetic material such that the active layer is magnetizable in first or second different active layer directions, at least partially in response to the magnetization direction of the region of intermediary magnetic material, the active layer having a second coercivity and a second permeability, wherein the region of intermediary magnetic material in each of the memory cells in the first plurality is separated magnetically from the region of intermediary magnetic material in all neighboring ones of the memory cells in the first plurality, and wherein either the second coercivity exceeds the first coercivity, or the second permeability is less than the first permeability, or both.

33. Apparatus according to claim 18, wherein the columns include alternating odd and even columns, and wherein the first column conductor of each of the cells in the first plurality which are in an even column is shared with the second column conductor of the cells in the first plurality which are in an odd column.

34. Apparatus according to claim 33, wherein the second column conductor of each of the cells in the first plurality with are in an even column is shared with the first column conductor of the cells in the first plurality which are in an odd column.

35. Apparatus according to claim 33, wherein the rows include alternating odd and even rows, wherein the row conductor for each of the odd rows is shared only by cells in odd columns, and wherein the row conductor for each of the even rows is shared only by cells in even columns.

36. Apparatus according to claim 33, wherein the electrically conductive structure and the cell selection mechanism are series connected in each cell in the first plurality, wherein for each of the cells in the first plurality that are in odd columns, the cell selection mechanism is electrically closer to the first column conductor to which the cell is connected, than is the electrically conductive structure, and wherein for each of the cells in the first plurality that are in even columns, the cell selection mechanism is electrically closer to the second column conductor to which the cell is connected, than is the electrically conductive structure.

* * * * *